(12) United States Patent
Usenko (10) Patent No.: US 6,355,493 B1
(45) Date of Patent: Mar. 12, 2002

(54) METHOD FOR FORMING IC'S COMPRISING A HIGHLY-RESISTIVE OR SEMI-INSULATING SEMICONDUCTOR SUBSTRATE HAVING A THIN, LOW RESISTANCE ACTIVE SEMICONDUCTOR LAYER THEREON

(75) Inventor: Alexander Yuri Usenko, Murray Hill, NJ (US)

(73) Assignee: Silicon Wafer Technologies Inc., Newark, NJ (US)

( * ) Notice: Subject to any disclaimer, the term of this patent is extended or adjusted under 35 U.S.C. 154(b) by 0 days.

(21) Appl. No.: 09/609,074

(22) Filed: Jun. 30, 2000

Related U.S. Application Data
(60) Provisional application No. 60/143,041, filed on Jul. 7, 1999.

(51) Int. Cl.[7] .......................... H01L 21/00; H01L 21/26
(52) U.S. Cl. .............................. 438/4; 438/149; 438/798
(58) Field of Search ........................ 438/4, 294, 149, 438/151, 403, 798, 799

(56) References Cited

U.S. PATENT DOCUMENTS

| | | | |
|---|---|---|---|
| 4,201,598 A | 5/1980 | Tanaka et al. | |
| 4,238,694 A | 12/1980 | Kimerling et al. | |
| 4,459,159 A | 7/1984 | O'Mara | |
| 4,469,527 A | 9/1984 | Sugano et al. | |
| 4,479,829 A | 10/1984 | Kniepkamp | |
| 4,684,413 A | 8/1987 | Goodman et al. | |
| 5,017,508 A | 5/1991 | Dodt et al. | |
| 5,292,672 A | 3/1994 | Akiyama et al. | |
| 5,747,872 A | 5/1998 | Lutz et al. | |
| 5,959,313 A | * 9/1999 | Yamazaki et al. | |
| 6,100,575 A | * 8/2000 | Minato | |

OTHER PUBLICATIONS

A.Y. Usenko, "A Novel VLSI Process Using electron Irradiation and Laser Annealing," Proc. IEEE Bipolar/BiCMOS Circuit and Technology 1992.

* cited by examiner

*Primary Examiner*—George Fourson
*Assistant Examiner*—Thanh V Pham
(74) *Attorney, Agent, or Firm*—DeMont & Breyer (57) ABSTRACT

A method for forming ICs comprising a highly-resistive or semi-insulating semiconductor substrate having a thin, low resistance active semiconductor layer thereon. In accordance with one embodiment of the method, the entire semiconductor substrate with at least partially prefabricated semiconductor devices disposed thereon is subjected to irradiation sufficient to impart high resistance throughout the substrate and active semiconductor layer. A thin, low resistance, active semiconductor layer is then generated on the substrate body by localized annealing. The (partially) prefabricated semiconductor devices are restored to operability by virtue of the annealing step as defects in the top insulating layers and properties of thin layers underneath the insulator-semiconductor interfaces are "healed." The annealing step does not, however, heal the defects in the bulk substrate so that it remains semi-insulating. The localized annealing step of the present invention is facilitated as a result of the difference in the thermal stability of radiation-induced defects in the bulk substrate and in the interface regions. Resultant semiconductor integrated circuits have decreased parasitic capacitances, decreased cross-talk, increased radiation hardness, suppressed latch-up, and improved speed action.

11 Claims, 8 Drawing Sheets

METHOD FOR FORMING IC'S COMPRISING A HIGHLY-RESISTIVE OR SEMI-INSULATING SEMICONDUCTOR SUBSTRATE HAVING A THIN, LOW RESISTANCE ACTIVE SEMICONDUCTOR LAYER THEREON

STATEMENT OF RELATED CASES

This application claims priority of provisional patent application Ser. No. 60/143,041, filed Jul. 7, 1999 and entitled "Method for Making Semi-Insulating Substrate by Post-Process Bombarding and Heating of Silicon-Based Microstructures," which is incorporated by reference herein.

FIELD OF THE INVENTION

The present invention relates generally to a method for making high-density integrated circuits ICs) and, more particularly, to a method for decreasing the fringing capacitance and increasing the speed-power product of such ICs.

BACKGROUND OF THE INVENTION

In the manufacture of ICs, it is desirable, in some cases, for the substrate of the ICs to be semi-insulating (ie., have very high resistivity). Such semi-insulating substrates advantageously decrease fringing capacitance and improve the speed-power product of p-n junctions built thereon. This, in turn, allows for closer spacing of p-n junctions and, hence, an increase in the density of active circuit devices that are built on the substrate.

The prior art describes various fabrication methods to produce an IC with a high resistivity substrate. Those methods are, however, disadvantaged by drawbacks related either to limitations of the particular substrate chosen or limitations of the fabrication process itself.

In a first group of methods for manufacturing semiconductor devices on low-conductivity substrate, the low conductivity substrates are first formed, and then semiconductor devices are fabricated thereon. The substrates used in such methods include: (1) gallium arsenide and other wide gap semiconductors, (2) sapphire, (3) pure silicon and (4) compensated silicon.

Surveying the methods used in conjunction with these substrates, gallium arsenide (GaAs) has been made semi-insulating by growing it under very high purity conditions or by doping it with chromium. Unfortunately, the process is not applicable for use with silicon.

As to item (2), sapphire, a high resistivity substrate is formed by growing an epitaxial silicon layer thereon. But silicon-on-sapphire integrated circuits are much more costly than silicon ICs.

Item (3), super-pure silicon, has high-resistivity (up to $2 \times 10^5$ Ohm cm at room temperature). While initially semi-insulating, the resistivity drops to about 100 Ohm cm due to the accumulation of contaminants and oxygen donors that occurs as semiconductor devices are fabricated on such silicon.

In yet another technique, gold (or platinum) is diffused into silicon to increase the resistivity thereof A drawback to this approach is that the diffused gold tends to contaminate semiconductor devices that are formed on the silicon.

In a second group of processes for manufacturing semiconductor devices on low-conductivity substrate, semiconductor devices are at least partially fabricated on a substrate, and then the substrate is rendered semi-insulating. One way to do this is by irradiating the device/substrate followed by annealing. Typically, irradiating/annealing methods use irradiating particles having energies in the millions of electron-volts (MeV) range and use an annealing temperature that is in the range of 250° C. to 450° C. A survey of such prior art follows.

In U.S. Pat. No. 4,469,527, Sugano et al. use high-flux thermal neutron irradiation to reduce silicon substrate conductivity. The irradiation introduces disordered regions in the silicon surface layer. After irradiation, Sugano et al. use pulsed laser processing with surface melting to anneal the disordered regions. In the Sugano et al. process, the dielectric parts (gates, etc.) of semiconductor devices are fabricated after neutron irradiation and after pulsed annealing. As a consequence, low temperature $SiO_2$ growth processes must be used in order not to heal the radiation-induced defects in the substrate that provide the substrate with its high resistivity. In particular, Sugano et al. use plasma anodization to grow $SiO_2$. Gate oxides produced by anodization tend to be of low quality. Moreover, neutron irradiation produces radioactive isotopes in the silicon substrates causing potentially dangerous radioactivity.

In U.S. Pat. No. 5,017,508, Dodt et al. use the irradiation/anneal process to control minority carrier lifetimes in power semiconductor devices of IGBT (insulated-gate-bipolar-transistor) type. In particular, high-energy electrons are introduced into the semiconductor device, which electrons displace silicon atoms from their normal lattice positions. The displaced atoms interact with the silicon or dopant atoms to form combinations of atoms having energy levels between the normal conduction and valence bands of silicon. These energy levels act as recombination centers, which reduce minority carrier lifetimes. Such control of minority carrier lifetime results in improved device characteristics. After irradiation, Dodt anneals the wafer/device to restore operability to fully-fabricated semiconductor devices.

In the power devices to which Dodt et al. is directed, current flows through the entire substrate. Consequently, in such devices, the substrate must not be rendered semi-insulating. To this end, Dodt et al. use relatively low dose irradiation, typically less then 10 Mrad, i.e. less than about $10^{15}$ cm$^{-2}$ of MeV-range energy electrons. (The term "dose" refers to the amount of radiation, not the energy thereof.) Such a dose is insufficient to significantly reduce the silicon substrate resistivity.

In U.S. Pat. No. 4,201,598, Tanaka et al. use the basic irradiation/annealing steps described above to remove or heal undesirable changes in the insulating portion of a semiconductor device while keeping desirable changes in the semiconductor portion of the device. Typically, radiation-induced changes in materials properties are caused by atomic displacements. Subsequent annealing promotes the return of displaced atoms (i.e., defects) to their initial locations, thereby canceling the action of the radiation and restoring the initial properties of the materials.

Tanaka et al. uses an annealing temperature that is in a range of between 250° C. and 350° C. to anneal a dielectric portion (ie., glass), but not semiconductor portions. The Tanaka et al. process is not applicable to CMOS. In particular, a MOSFET comprises both dielectric and semiconductor portions, and both such portions must be healed (i.e., annealed) to recover the operability thereof. Since Tanaka et al. anneal only the dielectric portion, the technique cannot be used for CMOS devices.

In U.S. Pat. No. 5,292,672, Akiyama et al. use spatially localized control of properties of the semiconductor portions of the semiconductor device using proton irradiation. Accelerated protons cause atomic displacements in materials at a depth at which they lose their energy and stop. This depth is in the range of about 0.1 to 10 microns from the surface, as a function of the initial energy of the accelerated protons. The protons also slightly affect the insulator layers of the semiconductor device before coming to rest. Akiyama et al. use subsequent annealing to heal the insulator portions of the semiconductor device. The accelerated protons disadvantageously do not render the entire semiconductor substrate semi-insulating, such that benefits of a semi-insulating substrate are not obtained.

In U.S. Pat. No. 4,684,413, Goodman et al. uses the irradiation/annealing process to improve the switching speed of semiconductor devices. Irradiation is also used to reduce minority carrier lifetime in the semiconductor portions of the semiconductor device. Annealing is used to remove radiation-induced defects that have a low thermal stability within the temperature operating range of the semiconductor device. Without such annealing, the presence of the low thermal stability-type defects would change the characteristics of the operating device. Unfortunately, Goodman et al., like Tanaka et al., is not applicable to CMOS.

In U.S. Pat. No. 4,479,829, Kniepkamp irradiates gallium arsenide substrate/prefabricated semiconductor devices with electrons to render the substrate highly resistive. Kniepkamp is not, however, applicable to silicon-based structures. A second disadvantage of Kniepkamp's process is the use of pulsed laser annealing for localized annealing. Laser annealing has low efficiency as a method for localized annealing and it is also complicated.

In U.S. Pat. No. 4,238,694, Kimerling et al. anneals radiation-induced defects in prefabricated semiconductor devices to obtain new functionality for the devices. Kimerling et al. uses localized heating caused by electrical current to achieve localized annealing. Such electrical heating has severe limitations with substantially curtail its usefulness.

In particular, in a typical IC, there may be hundreds of thousands or even millions of transistors. After irradiation, each of these transistors should be healed. But there are relatively few input/output wires that can be used for localized electrical heating. If such wires were used to attempt to anneal the complete IC, the current will find a shortest path and flow that way, leaving the major part of the IC unannealed and non-functioning. Kimerling is directed to a specific type of IC—a programmable gate array having separate contacts to each transistor in the array. For such an application, localized electrical heating is presumably suitable. This method is not, however, generally applicable.

In U.S. Pat. No. 4,459,159, O'Mara describes starting with an oxygenated silicon substrate and then forming semiconductor devices thereon. The silicon substrate is rendered semi-insulating after device formation by heating the substrate to about 450° C. Such temperatures produce donors from the interstitial oxygen within the substrate. These donors neutralize the dopant (e.g., boron), thereby increasing the resistivity of the substrate.

In "A Novel VLSI Process Using Electron Irradiation and Laser Annealing," IEEE 1992 BiPolar Circuits and Technology Meeting, pp. 121–124, Usenko describes converting a silicon low resistance substrate into semi-insulative substrate using irradiation followed by localized laser annealing. This publication, and all patents cited in this "Background" section are incorporated by reference herein.

In summary, the prior art describes localized device revival wherein a substrate and overlying semiconductor device are irradiated (i.e., damaged) and then defects in the semiconductor device only are "healed" by localized heating, such as by application of a laser or electrical current to a specified region. Moreover, the prior art describes some processes wherein the substrate and overlying semiconductor devices are irradiated, but the dose (not energy) of radiation is insufficient to substantially affect the resistivity of the complete substrate. A need therefore exists for a process capable of rendering a substrate resistive, but that accomplishes localized healing in a way that avoids the drawbacks of the prior art.

SUMMARY OF THE INVENTION

In some embodiments of a method in accordance with the present invention, a high resistivity or semi-insulating substrate having active semiconductor devices disposed thereon is formed.

In one embodiment in accordance with the present teachings, shallow impurities that are present throughout the substrate and overlying semiconductor devices of a processed semiconductor substrate are electrically deactivated via irradiation with a beam of accelerated electrons or other particles. As used in this Specification, the phrase "processed semiconductor substrate" refers to a semiconductor substrate having at least partially formed semiconductor devices disposed thereon. Such irradiation generates crystal lattice defects throughout the substrate and throughout overlying semiconductor devices. In some embodiments, the irradiation is carried out at a dosage that is sufficient to render the entire substrate semi-insulating.

The operability of the semiconductor devices that are disposed on the substrate is restored by thermal annealing. The thermal annealing step is carried out in such a way as to restore properties of the semiconductor devices (including prefabricated insulating layers, insulator-semiconductor interfaces and thin semiconductor films underneath the interfaces) but not the bulk substrate, which remains semi-insulating. In other words, as in the prior art, the present inventor uses spatially localized annealing to restore the operability of semiconductor devices while retaining the radiation-induced high resistivity of the substrate. But the manner in which spatially localized annealing is effected in the present invention is different than in the prior art.

In particular, the present inventor has recognized that spatially localized annealing is advantageously performed by utilizing a differential in the annealing behavior of the bulk/interior regions of the silicon substrate, on the one hand, and the surface/interface regions of the silicon substrate, on the other hand. In particular, the surface/interface regions "heal" or "restore" at temperatures that are about 100° C. to 170° C. lower than bulk regions. Thus, in accordance with some embodiments of the present invention, processed semiconductor substrate is annealed, in total, at appropriately-selected annealing conditions (e.g., temperature). Due to the differential in annealing behavior, the semiconductor devices heal, while the bulk substrate does not. As a consequence, the substrate remains semi-insulating while the semiconductor devices are restored to operability.

Embodiments of the present method therefore avoid the drawbacks associated with localized illumination/heating, as practiced in the prior art, to achieve localized annealing.

Since the semiconductor device is fabricated in a semi-conductive layer that is formed at the surface of the semi-insulating substrate produced by irradiation, no junction capacitance is produced at the P-N junction and the capacitance relative to ground is reduced. The reduced capacitance decreases delay time. As a consequence, the operating frequency bandwidth of the semiconductor devices is broadened and the operating speed of the semiconductor devices is increased relative to semiconductor devices that are disposed on substrates having lower resistivity.

DETAILED DESCRIPTION

Figure 1:
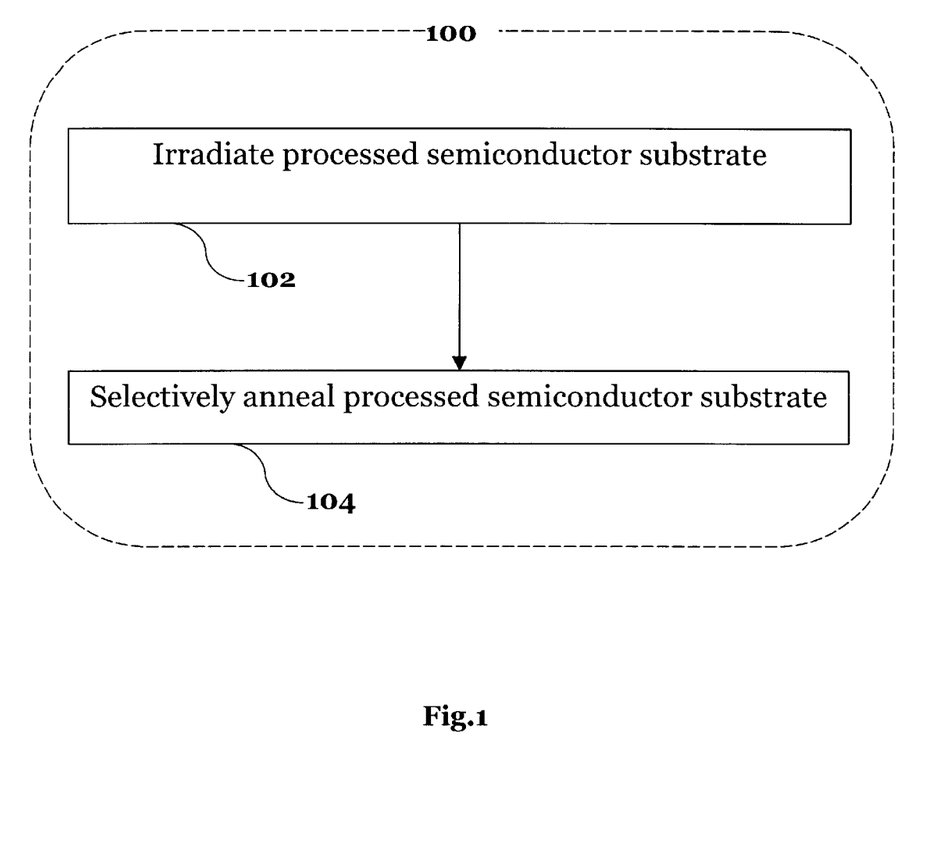
FIG. 1 depicts an embodiment of a method in accordance with the illustrated embodiment of the present invention.

FIG. 1 depicts an embodiment of a method 100 in accordance with the present teachings. As indicated in operation block 102, a processed semiconductor substrate is irradiated. As used herein, the term "irradiated" or "irradiation" means exposure to radiation in the form of electron beams, proton beams, neutron beams, $\alpha$-rays, $\beta$-rays, $\gamma$-rays, and the like. The energy of such radiation is in the range of from about 0.3 to 100 MeV, hereinafter "MeV-range." A radiation source capable of generating point defects only, such as an electron beam and $\gamma$-rays, is advantageously used.

Figure 2:
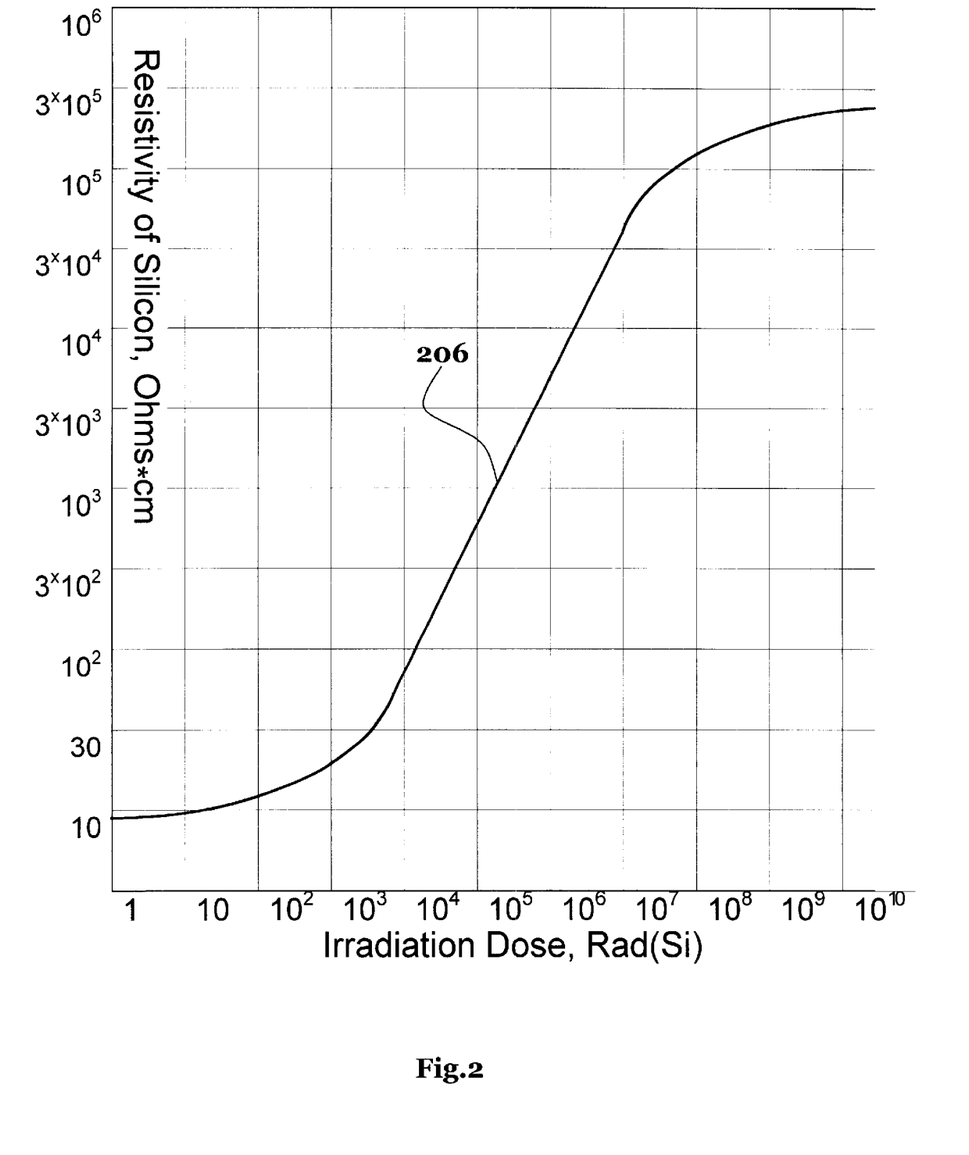
FIG. 2 depicts a plot that expresses silicon resistivity as a function of ionizing radiation dose.

FIG. 2 depicts a plot 206 that shows the resistivity of silicon as a function of ionizing radiation dose. Plot 206 shows that resistivity increases with increasing ionizing radiation dose, expressed as "Rad(Si)." ("Rad," which stands for "radiation absorbed dose," is the energy transferred to a material by ionizing radiation. One rad is equal to the energy of 100 ergs per gram of material. Since the amount of energy absorbed is, in part, a function of the material that is being irradiated, that material must be specified—hence "rad(Si)" means "radiation absorbed dose for silicon").

At a high dose of radiation (i.e., over $10^8$ Rad/Si, which is equal to about $10^{17}$ electrons per square centimeter for electrons with energy from 1 to 10 MeV), the resistivity saturates at the value that is equal to resistivity of intrinsic silicon substrate, which is $2 \cdot 10^5$ cm$^{-1}$. See D. E. Hill, "Electron Bombardment of Silicon", Physical Review, vol.114, No.6, pp.1414–1420, 1959.

To render a substrate substantially completely semi-insulating, the dose of radiation is at least about $10^{17}$ electrons per square centimeter. A somewhat lower dose of about $10^{16}$ electrons per square centimeter is sufficient if latch-up suppression only is required. "Latch up" refers to a well-known phenomenon particular to CMOS structures. In particular, side-by-side MOS transistors form a lateral bipolar (NPN) transistor that can function as an unwanted amplifier. The output of the "amplifier" increases to a point at which the transistors cannot be switched—latch-up.

It should be understood that the radiation dosage level required to render a substrate completely compensated (ie., semi-insulating) is a function of a variety of factors including, without limitation, substrate temperature, the concentration of oxygen in the silicon substrate and the type and amount of impurities in the silicon substrate. The radiation dose given above should therefore be considered to be guidelines applicable for a nominal commercially available silicon that is maintained at a temperature within the range of about room temperature (ie., about 20° C.) to about 200° C. during irradiation operation 102. In embodiments in which the substrate temperature is maintained below room temperature (ie., about 20° C. or less) during irradiation, complete compensation of the bulk substrate is obtainable at a lower total dose of radiation than would otherwise be required. For example, at the temperature of liquid nitrogen, the dose required for complete compensation of silicon substrate may be less than $10^{16}$ electrons per square centimeter. Again, the precise dose required is a function of a variety of factors and is best determined by routine experimentation.

The semiconductor devices of the irradiated processed semiconductor substrate are at least partially fabricated. By way of example, in one embodiment, a partially fabricated semiconductor device refers to a device that is missing metal interconnections, dielectric layers between metal interconnections and passivating dielectric. Such portions of the semiconductor device are fabricated after irradiation (operation 102) and after annealing (operation 104).

Irradiating the processed semiconductor substrate in accordance with operation 102 generates a large amount of lattice defects. When the irradiation is with high-energy electrons or gamma rays, only point defects result. The defect concentration has a saturated value of about $10^{18}$ defects per cubic centimeter. The saturated value depends on impurity concentrations in silicon. Czochralski grown silicon contains about $1.8 \times 10^{18}$ atoms per cubic centimeter of oxygen and about $10^{17}$ atoms per cubic centimeter of all others impurities, collectively.

Under irradiation, almost all impurities transform into vacancy-impurity or interstitial-impurity pairs or clusters containing three to eight members. The vacancy-impurity type centers have an electrical activity, and all of them have deep energy levels within the silicon forbidden gap. The deep levels do not add free carriers (i.e., electrons or holes), so that irradiated semiconductor attains low conductivity that is close to conductivity of un-doped semiconductor ($2 \cdot 10^5$ Ohm·cm for silicon at room temperature).

Point defects in bulk silicon are thermally stable to about 470° C. The thermal stability in bulk silicon is primarily determined by the "A-center," which is a vacancy-oxygen pair. Point defects that are in the vicinity of interfaces (e.g., the interface between the substrate and the $SiO_2$ that serves as the electrical insulation between adjacent transistors) have lower thermal stability. In particular, point defects that are near interfaces are thermally stable to about 300° C. Such lower thermal stability results from mechanically-stressed fields that arise due to the presence of the interfaces. The fields serve as a drain for the defects. In other words, the thermal stability of radiation-induced defects is not determined by bonding energies of particular type of radiation-induced defect, but rather by the ability of the defects to diffuse to the nearest drains.

The thermal stability of charge captured in dielectric layers is less than 300° C. Also, the thermal stability of interface states at the Si—SiO$_2$ interface is less than 300° C.

As a consequence of these differences in thermal stability, the present inventor recognized that a window between 300° C. and 470° C. allows for selective "healing" of radiation-induced damage in the semiconductor devices overlying the substrate. Thermal treatment in this range is insufficient to remove radiation-induced defects in the bulk substrate, so the bulk substrate remains highly resistive.

Thus, to provide a semiconductive layer at the surface of the semi-insulating substrate, the processed semiconductor substrate is thermally annealed in accordance with operation 104. The temperature of annealing operation 104 is within the range of about 300–460° C. Annealing is carried out for a period of time with a range of about 1 to $10^4$ seconds. The annealing operation is performed, for example, in an oven. As a result of operation 104, lattice defects in a portion of the semi-insulating substrate that is just below the irradiated surface are extinguished. Thus, in accordance with the present invention localized healing of radiation-induced defects is effected by taking advantage of the difference in the thermal stability of defects. This is in contrast to the prior art, which performs localized healing by attempting to apply heat to only the regions that are to be healed.

It will be understood that a temperature higher than 460° C., but just below 470° C., can be used as the upper limit on annealing temperature. But providing a buffer of less than 10° C. may result in some amount of defect healing in the bulk silicon, such that the resistivity of the substrate will decrease.

Figure 3:
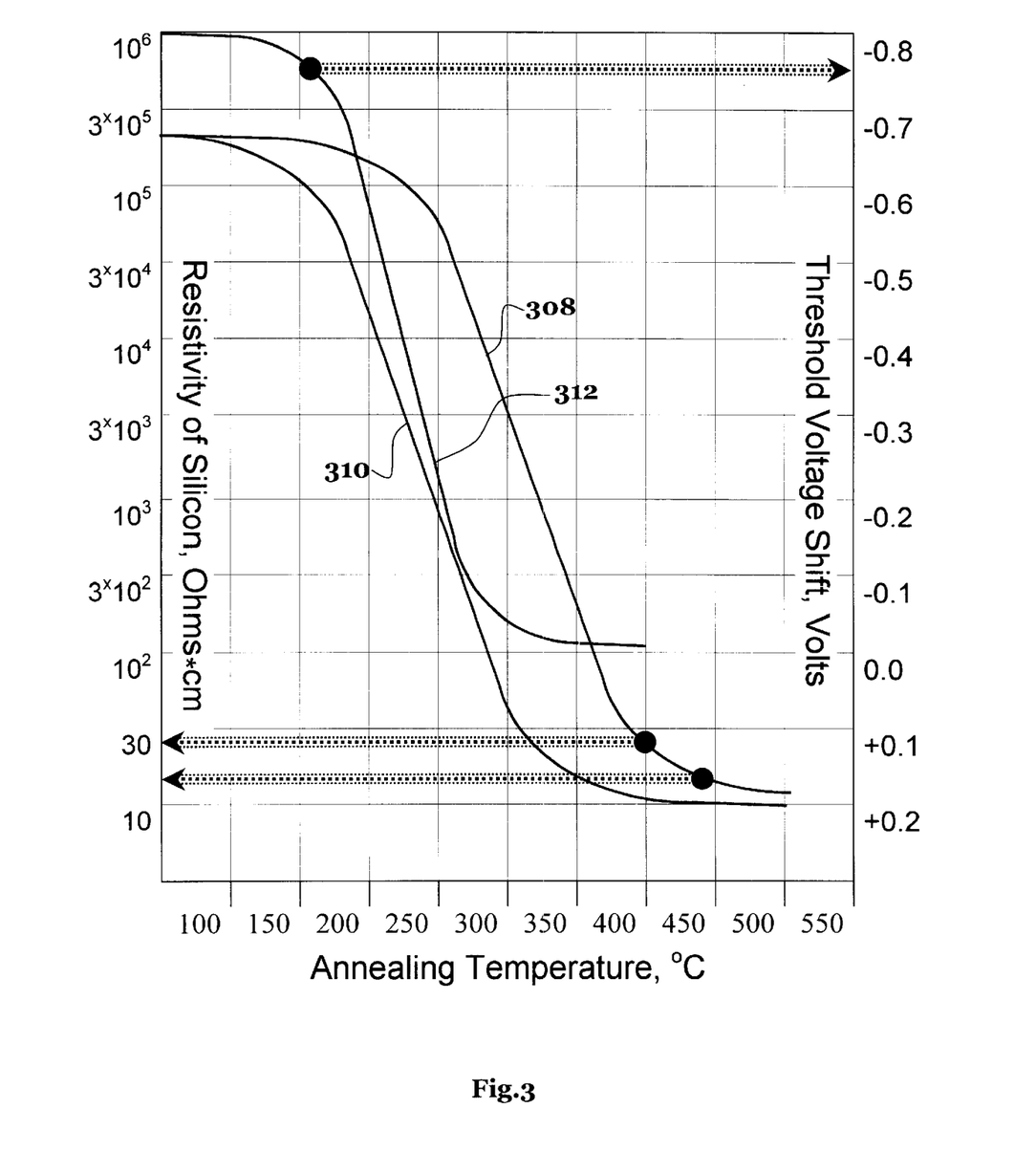
FIG. 3 depicts plots that express (1) resistivity of irradiated bulk silicon, (2) resistivity of irradiated interface silicon and (3) threshold voltages of irradiated MOS transistors as a function of annealing temperature.

FIG. 3 depicts resistivity as a function of annealing temperature for irradiated "bulk silicon" 308 and irradiated "interface silicon" 310 (ie., 0.1 micron and less from the surface of the substrate or interface between the substrate and active semiconductor devices).

FIG. 3 shows that the resistivity of silicon near the surfaces/interfaces (plot 310) restores at temperatures that are about 100° C.–170° C. lower than the temperatures at which such restoration occurs in bulk silicon (plot 308). As used in this context, the term "restore" is defined as follows. The resistivity of silicon is considered to be restored when, via annealing, silicon resistivity is less than or equal to kR, where R is the resistivity of silicon before irradiation and k is a coefficient, where: k≈e≈2.71. Typically, when resistivity to falls to a value on the order of about 30 Ohm·cm, resistivity is considered to be restored.

FIG. 3 also shows typical behavior of threshold voltage 312 under annealing. As plot 312 shows, the threshold voltage restores at about the same temperatures as resistivity for near-interface areas of silicon. As used in this context, the term "restore" is defined as follows. Each IC has a range of allowed threshold voltage for p-channel transistors and n-channel transistors. The threshold voltage is "restored" when, through annealing, threshold voltages return to that range. By way of example, a typical IC has a threshold voltage of about 0.5±0.1 Volts. It is quite fortuitous that both characteristics that determine MOS transistor operability—threshold voltage and silicon conductivity in the channel of the MOS transistor—are restored at about the same temperature.

Semiconductor devices processed in accordance with the present teachings exhibit a substantial degree of radiation "hardness" (ie., resistance to damage caused by ionizing radiation). In particular, ionizing radiation, such as is emitted by a variety of galactic sources, or as is emitted when nuclear weapons are detonated, generate charge carriers (electron-hole pairs) in the silicon substrate of such semiconductor devices. In radiation "soft" devices, the accumulation of positive charge in various dielectric regions of the device causes the parasitic transistor (inherent in the structure of such devices) to conduct when the actual operating transistor is not conducting. Current leakage results.

In devices that are formed in accordance with the present teachings, the radiation-induced charge carriers do not accumulate because they recombine in the substrate with radiation-induced defects that were generated by virtue of irradiation step 102 of the present method. Devices formed in accordance with the present teachings have a high concentration of annihilation centers for vacancies and interstitials and are therefore characterized by a very low rate of accumulation of radiation-induced defects upon secondary irradiation.

In the Examples that follow, illustrative method 100 is used to fabricate various types of ICs. It should be understood that the following Examples are provided by way of illustration, not limitation.

EXAMPLE 1

CMOS

Figure 4:
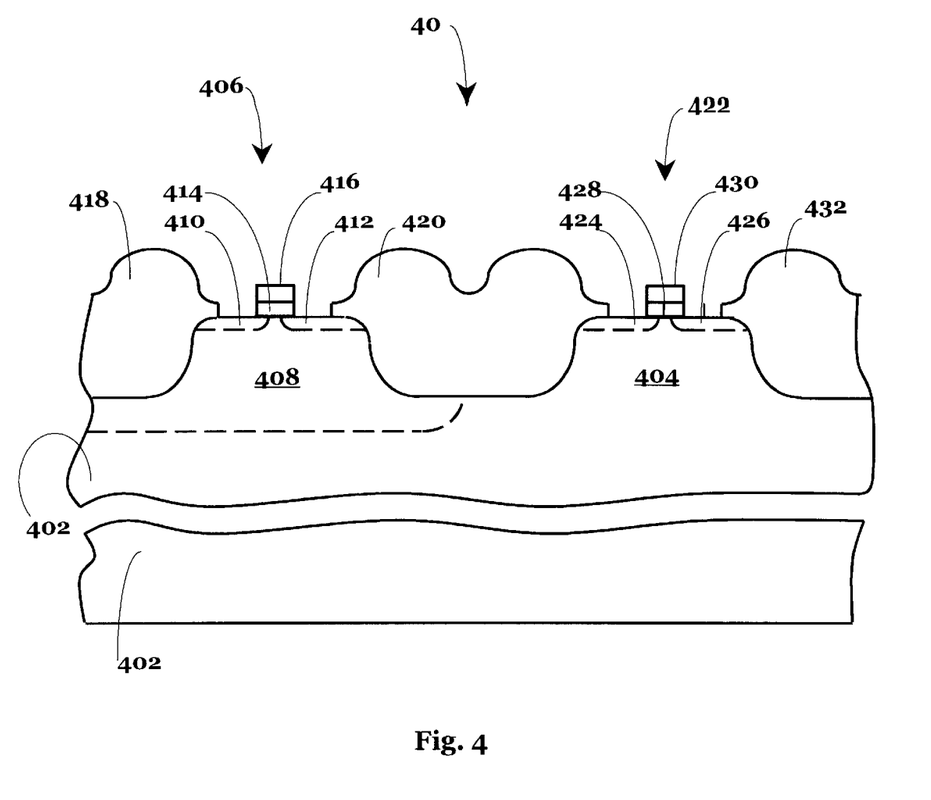
FIG. 4 depicts a schematic cross-section of an illustrative CMOS cell that is processed in accordance with the present method.

FIG. 4 depicts a stage in the fabrication of CMOS IC 400 in accordance with the present teachings. At the stage depicted in FIG. 4, the nascent IC 400 has a conventional structure and has been fabricated in accordance with known methods. Nascent CMOS IC 400 includes p-type substrate 402 and various regions that, collectively, form p-MOS transistor 406 and n-MOS transistor 422 that are disposed near top 404 of silicon substrate 402.

More particularly, illustrative p-MOS transistor 406 includes n$^-$-well 408, source 410 and drain 412 that are formed via p$^+$-implantation, gate dielectric 414 and polysilicon gate 416. Transistor 406 is flanked by electrical insulators 418 and 420 that are formed, for example, by local oxidation of silicon ("LOCOS"). Illustrative n-MOS transistor 422 includes source 424 and drain 426 that are formed via n$^+$-implantation, gate dielectric 428 and polysilicon gate 430. Transistor 422 is flanked by electrical insulators 420 and 432.

At the stage of fabrication depicted in FIG. 4, metal interconnections, dielectric layers between metal layers, and a passivating layer are not formed. Such layers are advantageously formed after the irradiation and annealing steps of method 100.

Figure 5:
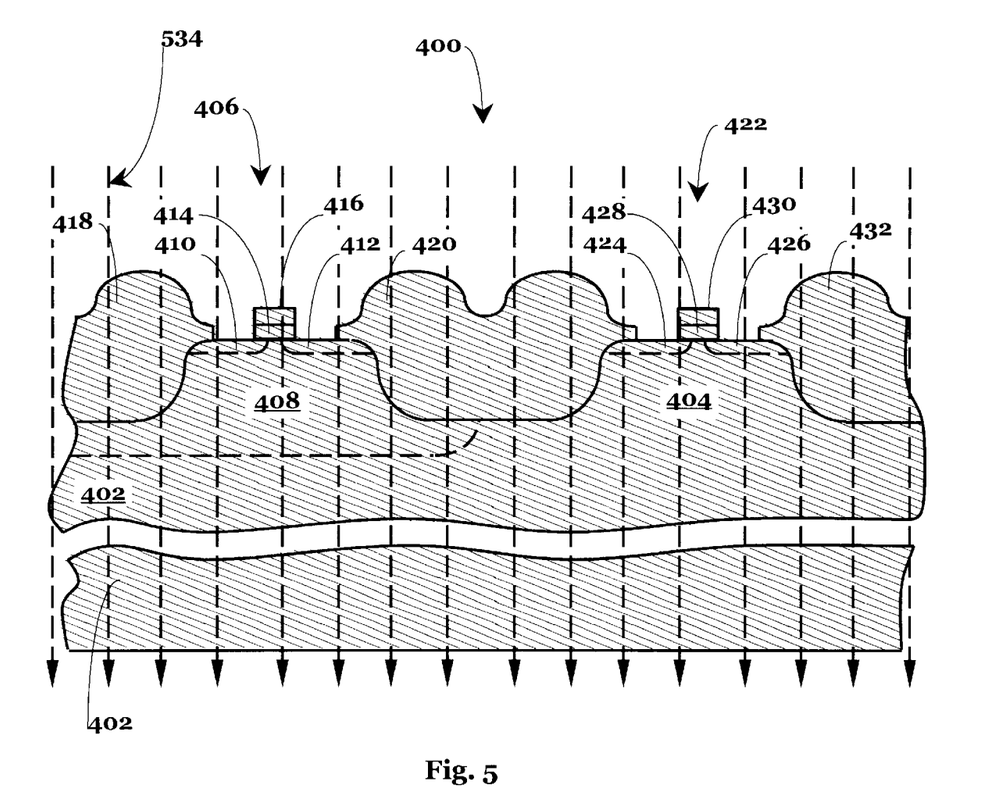
FIG. 5 depicts the CMOS cell of FIG. 4 under irradiation in accordance with the present teachings.

FIG. 5 depicts the structure of FIG. 4 being irradiated in accordance with operation 102 of method 100 (FIG. 1). In the illustrated embodiment, such irradiation is delivered in the form of high-energy electrons 534 from a linear accelerator (not shown). The total dose of electrons 534 advantageously exceeds $10^{17}$ electrons per square centimeter when a semi-insulating substrate is desired, and is advantageously about $10^{16}$ electrons per square centimeter when only latch-up suppression is desired.

The irradiation operation, when carried out at a dose greater than about $10^{17}$ electrons per square centimeter, causes regions 402 and 404 of the substrate to become highly resistive. Moreover, the active regions of nascent CMOS IC 400 are rendered inoperative as a result of a change of threshold voltage of MOS transistors 406 and 422. The change in threshold voltage is due to the accumulation of positive charge on respective gate oxides 414 and 428, and is also due to the decrease in channel current due to the increase in resistivity of silicon in channel region. The parallel line segments appearing throughout the structure depicted in FIG. 5 indicate radiation damage. Note that such damage has occurred to all regions of nascent CMOS IC 400.

Figure 6:
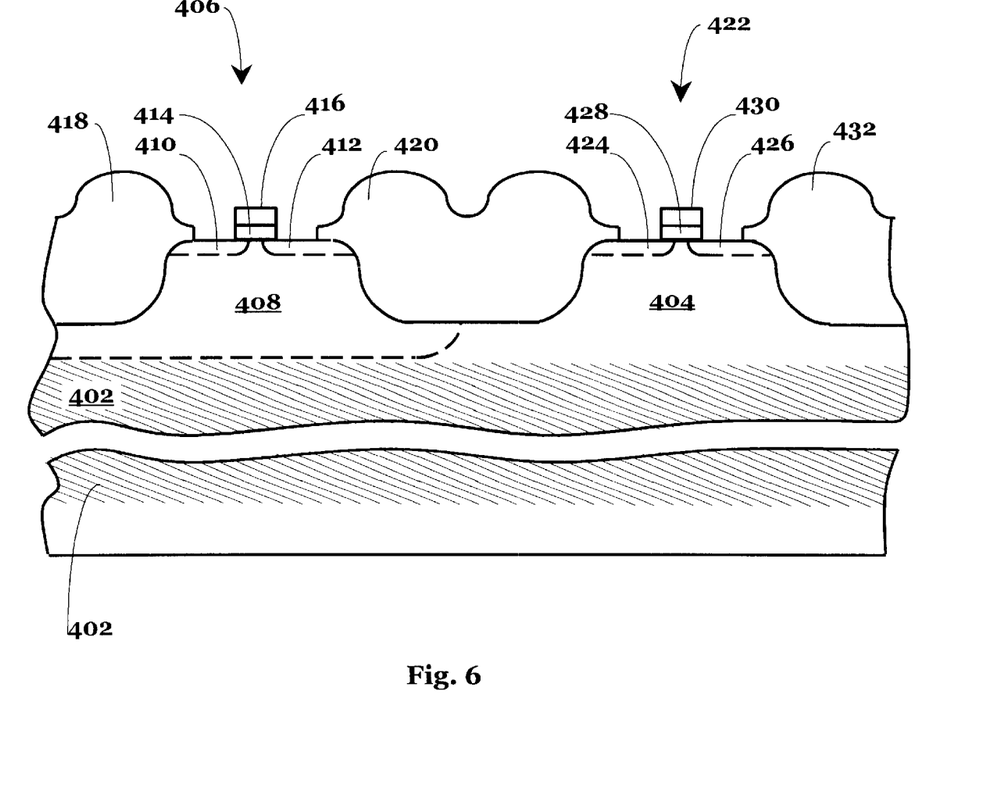
FIG. 6 depicts the CMOS cell of FIG. 5 after thermal annealing in accordance with the present teachings.

In accordance with the present teachings, the irradiated structure is annealed, as per operation 104 of method 100. FIG. 6 depicts changes to the structure of FIG. 5 due to annealing operation 104.

As depicted in FIG. 6, substrate region 402 maintains high resistance, indicative of a low incidence of defect healing, while defects above interface in overlying silicon regions 404, 408, 410, 412, 424, and 426 are healed, such that those regions are restored to semiconductivity. Moreover, dielectric elements 414, 418, 420, 428 and 432 lose positive charge that was accumulated under irradiation, such that the initial properties thereof are restored. In addition, the interfaces between dielectric regions 414, 418, 420, 428 and 432 and silicon regions 404 and 408 that accumulate interface states under irradiation are restored to their pre-irradiation conditions by virtue of the annealing step.

Final operations in the fabrication of CMOS IC 400 are the same as those in conventional technologies: metallization, scribing, etc. (final structure not depicted). It is advantageous to limit post-processing operations to a maximum temperature that is no higher than the annealing temperature (i.e., operation 104) to prevent any opportunity for further annealing that might decrease the resistivity of the bulk substrate.

A modified ohmic-contact interconnection process with decreased processing temperature (300° C. instead of 470° C.) is therefore advantageously used. Such modified processes are known in the art. See, e.g., Van Zant, P., "Microchip Fabrication," (4$^{th}$ Ed., McGraw Hill, © 2000), Chapter 13: Metallization. Also, a known planarization process using polyimide film instead of the standard planarization process with PSG glass melting can be used to keep post processing temperatures lower than 300° C. See, e.g., J. D. Plummer et al., "Silicon VLSI Technology: Fundamentals, Practice, and Modeling," (Prentice Hall, © 1999), Part 9: Thin Film Deposition.

For post processing process technologies that are difficult to limit to low temperatures (e.g., 300° C.), one alternative is to apply the irradiation and annealing operations of the present invention to a fully fabricated semiconductor device (see Example 3).

EXAMPLE 2

Bipolar

Figure 7:
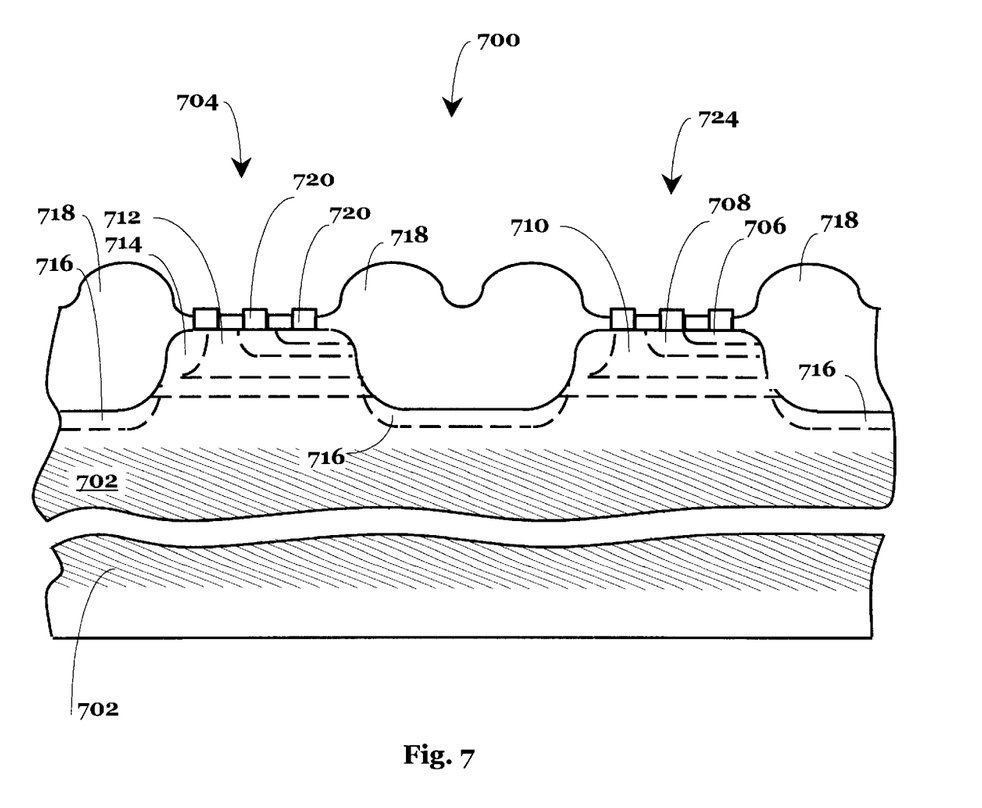
FIG. 7 depicts, via a simplified cross-section, an embodiment of a bipolar integrated circuit that is fabricated in accordance with the present teachings.

FIG. 7 depicts a stage in the fabrication of an IC 700 comprising bipolar transistors. At the stage depicted, IC 700 has been subjected to irradiation and annealing in accordance with respective operations 102 and 104 of method 100. The cross-sectional view depicts two neighboring bipolar transistors 704 and 724 overlying bulk substrate 702.

Each bipolar transistor comprises emitter n$^+$ silicon region 706, base p-type silicon region 708, collector n$^-$ silicon region 710, collector n$^+$ epitaxial region 712, collector n$^+$ diffused region 714, p$^+$ stop-channel regions 716, silicon dioxide insulating regions 718, ohmic contacts 720 (typically either metal, silicide or doped polysilicon) to emitter 706, base 708 and collector 710 of transistors 704 and 724, first interconnection layer 722. For clarity of presentation, planarization and all subsequent metal levels are not shown. The parallel line segments indicate the presence of radiation induced-defects. Bulk substrate 702 is shown to have high resistivity.

Integrated circuits for low temperature operation (e.g., liquid nitrogen) can be produced and very high speed integrated circuits ("VHSICs") can be manufactured using an advanced type of device-to-device electrical isolation. Such isolation is realized by the semi-insulating silicon substrate resulting from the illustrative method. In particular, the high-flux irradiation of step 102 causes the resistivity of silicon substrate 702 resistivity to saturate near the value of undoped silicon over its entire bulk. During the differential annealing operation, bulk substrate 702 remains highly resistive, while the operability of the transistors are restored. As a result, transistors 704 and 724 are completely isolated.

EXAMPLE 3

Silicon-on-Insulator CMOS

Figure 8:
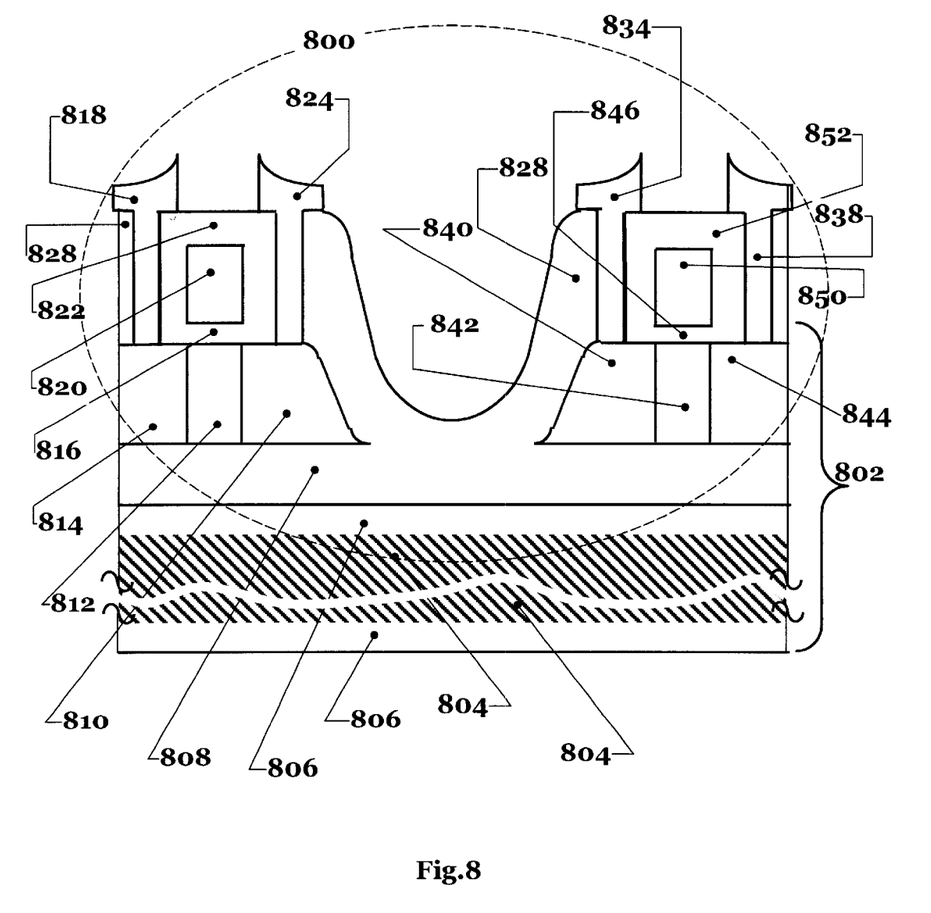
FIG. 8 depicts, via a simplified cross-section, an embodiment of a silicon-on-insulator CMOS cell that is fabricated in accordance with the present teachings.

FIG. 8 shows a simplified schematic cross section of CMOS IC 800 fabricated on silicon-on-insulator wafer 802. CMOS IC 800 is depicted after irradiation and annealing steps have been performed in accordance with the present teachings. In contrast to Examples 1 and 2, which are directed toward partially fabricated semiconductor devices, this Example applies the illustrative process to a fully fabricated device.

Regions 804 and 806 comprise the "handle" part (i.e., the thick region of silicon) of the starting silicon-on-insulator wafer 802. Region 808 is the buried oxide layer of silicon-on-insulator wafer 802. And regions 810, 812, 814, 816, 840, 842, 844 and 846 are made from the top silicon layer of the silicon-on-insulator wafer. The remaining regions that are depicted in FIG. 8 are made by depositions of materials onto the surface of starting silicon-on-insulator wafer 802.

Regions 810, 812, 814, 816, 818, 820, 822 and 824 collectively constitute a p-channel MOS transistor of CMOS cell 800. In particular, regions 810 and 814 are, respectively, a source and a drain, both comprising p$^+$ silicon. Region 812 is a channel comprising n-type silicon. Region 816 is a gate dielectric, region 820 is a highly p$^+$ doped polysilicon gate and region 822 is electrically-insulating material (e.g., oxidized polysilicon).

Region 818 and 824 comprise ohmic contacts and a first level interconnection metal. Region 828 is a silicon dioxide layer that provides electrical isolation between transistors. The final CMOS IC 800 advantageously contains several more interconnection layers that are not shown here for the sake of clarity.

The right side of the FIG. 8 depicts a n-MOS transistor that is formed, collectively, by regions 840, 842, 844, 846, 850 and 852 having the same functionality as the corresponding regions of the p-MOS transistor described above. All regions 808–852 are advantageously thin layers having at least one dimension that is less than about 0.2 micron. Layers so dimensioned are annealed to restore their initial electrical values at temperatures that are substantially lower than the temperature required to heal radiation-induced changes in bulk substrate 804. Regions 806 are transitional regions that, due to their proximity to a surface (ie., bottom surface of the handle portion of SOI 802) or to an interface with another material (ie., buried oxide layer 808), have a conductivity that is less than that of intrinsic silicon, but higher than that of bulk substrate 804.

It is to be understood that the above-described embodiments are merely illustrative of the invention and that many variations may be devised by those skilled in the art without departing from the scope of the invention and from the principles disclosed herein. It is therefore intended that such variations be included within the scope of the following claims and their equivalents.

What is claimed is:

1. A method comprising:

irradiating with high-energy electrons or gamma rays a doped semiconductor substrate and an at least partially fabricated semiconductor device that overlies said semiconductor substrate with a dose of radiation sufficient to increase the resistivity of said semiconductor substrate until it is about equal to a resistivity of said semiconductor substrate in an undoped form;

heating said semiconductor device and said semiconductor substrate to a temperature in a range of about 300° C. to about 460° C. until operability of said semiconductor device is restored.

2. The method of claim 1 wherein said semiconductor substrate comprises silicon.

3. The method of claim 2 wherein said radiation is suitable for producing only point defects in said semiconductor substrate.

4. The method of claim 3 wherein said radiation comprises accelerated electrons having an energy of at least 0.1 MeV and a flux exceeding 1017 electrons per square centimeter.

5. The method of claim 1 wherein said semiconductor substrate and at least partially-fabricated semiconductor device comprises a silicon-on-insulator wafer.

6. The method of claim 1 further comprising post processing at temperature not exceeding 300° C. of said at least partially fabricated semiconconductor device, said post processing comprising the formation of ohmic contacts, the formation of interconnections, planarization, and depositing a passivation layer.

7. A method comprising:

generating radiation-induced defects in a silicon substrate and in an overlying transistor, wherein said defects are suitable for increasing a resistivity of said substrate until said resistivity is about equal to a resistivity of intrinsic silicon, and further wherein said defects are suitable for impairing operability of said transistor; and healing said defects in said transistor but not in said silicon substrate, wherein said healing is effected by heating both said silicon substrate and said transistor to a first temperature that is sufficient for healing said defects in said transistor but insufficient for healing said defects in said silicon substrate.

8. The method of claim 1 wherein said defects are only point defects.

9. The method of claim 8 wherein said silicon substrate has a temperature of about 20° C. or less during the generation of said defects.

10. The method of claim 8 wherein said transistor is a MOS transistor.

11. The method of claim 8 wherein said transistor is a bipolar transistor.

* * * * *